United States Patent
Mizowaki et al.

(10) Patent No.: US 10,650,939 B2
(45) Date of Patent: *May 12, 2020

(54) ELECTRICALLY CONDUCTIVE ADHESIVE AGENT, JOINED BODY, AND JOINT

(71) Applicant: Senju Metal Industry Co., Ltd., Tokyo (JP)

(72) Inventors: Toshio Mizowaki, Saitama (JP); Yoshinori Takagi, Saitama (JP)

(73) Assignee: Senju Metal Industry Co., Ltd., Tokyo (JP)

( * ) Notice: Subject to any disclaimer, the term of this patent is extended or adjusted under 35 U.S.C. 154(b) by 162 days.

This patent is subject to a terminal disclaimer.

(21) Appl. No.: 14/910,406

(22) PCT Filed: Apr. 15, 2014

(86) PCT No.: PCT/JP2014/060728
§ 371 (c)(1),
(2) Date: Feb. 5, 2016

(87) PCT Pub. No.: WO2015/019666
PCT Pub. Date: Feb. 12, 2015

(65) Prior Publication Data
US 2016/0194525 A1    Jul. 7, 2016

(30) Foreign Application Priority Data

Aug. 6, 2013    (JP) .................................. 2013-162932

(51) Int. Cl.
*H01B 1/22* (2006.01)
*B22F 1/00* (2006.01)
(Continued)

(52) U.S. Cl.
CPC ............. *H01B 1/22* (2013.01); *B22F 1/0059* (2013.01); *C09J 9/02* (2013.01); *C09J 11/04* (2013.01);
(Continued)

(58) Field of Classification Search
CPC . H01B 1/20; H01B 1/22; B22F 1/0059; B22F 1/007; B22F 2001/0066;
(Continued)

(56) References Cited

U.S. PATENT DOCUMENTS 4,495,007 A * 1/1985 Zado .................. B23K 35/3618
106/268
5,136,365 A * 8/1992 Pennisi ................. H01L 21/563
148/24

(Continued)

FOREIGN PATENT DOCUMENTS

CN    101232967 A    7/2008
JP    2000192000 A    7/2000
(Continued)

OTHER PUBLICATIONS

A. Cottrell, "Introduction to Metallurgy (2nd Edition)," Maney Publishing for IOM3, the Institute of Materials, Minerals and Mining, pp. 484-488. (Year: 1975).*

(Continued)

*Primary Examiner* — Matthew R Diaz
(74) *Attorney, Agent, or Firm* — The Webb Law Firm

(57) ABSTRACT

This invention has an object to provide an electrically conductive adhesive agent which enables a thermosetting resin to cure in a short time. It contains electrically conductive metallic powder including Sn, the thermosetting resin; an acid-anhydride-based hardening agent and an organic acid. The electrically conductive metallic powder and the organic acid are reacted during a heating process to produce (Continued)

an organic acid metal salt which is used as hardening accelerator. It enables thermosetting resin to cure in a short time, for example, a time equivalent to a time that is required for the general reflow process.

6 Claims, 1 Drawing Sheet

(51) Int. Cl.
*C09J 9/02* (2006.01)
*C09J 11/04* (2006.01)
*C09J 11/06* (2006.01)
*C09J 163/00* (2006.01)
*H05K 3/32* (2006.01)
*C22C 1/04* (2006.01)
*C08K 3/08* (2006.01)

(52) U.S. Cl.
CPC ............ *C09J 11/06* (2013.01); *C09J 163/00* (2013.01); *C22C 1/0483* (2013.01); *H05K 3/321* (2013.01); *B22F 2001/0066* (2013.01); *C08K 3/08* (2013.01); *C08K 2201/001* (2013.01); *H05K 2203/1446* (2013.01)

(58) Field of Classification Search
CPC ...... C08K 3/08; C08K 3/11; C08K 2201/001; C09J 9/02; C09J 11/04; C09J 11/06; C09J 163/00; C09J 163/04; C09J 163/06; C09J 163/08; C09J 163/10; C09J 5/06; C09J 11/08; C22C 1/0483; C22C 13/00; C22C 13/02; H05K 3/321; H05K 2203/0425; H05K 3/323; H05K 3/386; H05K 2201/10984; H05K 2203/1194; H05K 2203/121; B23K 35/0244; B23K 35/025; B23K 35/3613; B23K 35/3618; B23K 35/362; H01R 4/04
See application file for complete search history.

(56) References Cited

U.S. PATENT DOCUMENTS

| | | | | |
|---|---|---|---|---|
| 6,054,761 A * | 4/2000 | McCormack | ..... | H01L 23/49883 174/262 |
| 6,059,894 A * | 5/2000 | Pendse | ...... | B23K 35/3618 148/23 |
| 6,402,013 B2 * | 6/2002 | Abe | ..... | B23K 35/3613 148/23 |
| 7,326,369 B2 * | 2/2008 | Cheng | ..... | C08L 63/00 252/512 |
| 7,575,150 B2 * | 8/2009 | Saito | ..... | B23K 1/0016 228/180.22 |
| 8,227,536 B2 | 7/2012 | Watanabe et al. | | |
| 8,293,370 B2 * | 10/2012 | Yamaguchi | ..... | B23K 35/025 148/23 |
| 8,564,140 B2 | 10/2013 | Hariharan et al. | | |
| 2004/0074089 A1 | 4/2004 | Gilleo | | |
| 2005/0056687 A1 | 3/2005 | Matsumoto et al. | | |
| 2010/0006625 A1 * | 1/2010 | Eom | ..... | B23K 3/0623 228/164 |
| 2011/0049439 A1 * | 3/2011 | Higuchi | ..... | H01B 1/22 252/512 |
| 2012/0073869 A1 * | 3/2012 | Kishi | ..... | C09J 9/02 174/259 |
| 2013/0146342 A1 * | 6/2013 | Eom | ..... | C25D 5/02 252/512 |
| 2013/0279118 A1 | 10/2013 | Koyama et al. | | |
| 2013/0295311 A1 * | 11/2013 | Larson | ..... | B32B 7/12 428/40.1 |

FOREIGN PATENT DOCUMENTS

| | | |
|---|---|---|
| JP | 2001219294 A | 8/2001 |
| JP | 2004277701 A | 10/2004 |
| JP | 2006199937 A | 8/2006 |
| JP | 2006265484 A | 10/2006 |
| JP | 2010144150 A | 7/2010 |
| JP | 201161241 A | 3/2011 |
| JP | 201254518 A | 3/2012 |
| JP | 201267274 A | 4/2012 |
| JP | 2012188646 A | 10/2012 |
| WO | 2010036953 A2 | 4/2010 |

OTHER PUBLICATIONS

Siewert et al. ("Properties of Lead-Free Solders," National Institute of Standards and Technology). (Year: 2002).*
Su et al., "Review on Accelerators Used for Curing Reaction of Epoxy Resin/Acid Anhydride", The 43rd Institute of the Fourth Academy of CASC, Xi' an, 710025, China (Sep. 2014), 19.5, pp. 35-38, English-language Abstract p. 38.
Yonezumi et al., "Analysis of Curing Reaction for Resin-Enhanced Solder Metal Paste", Panasonic Technical Journal, Apr. 2013, pp. 72-77, vol. 59:1 [English-language Abstract included].

* cited by examiner

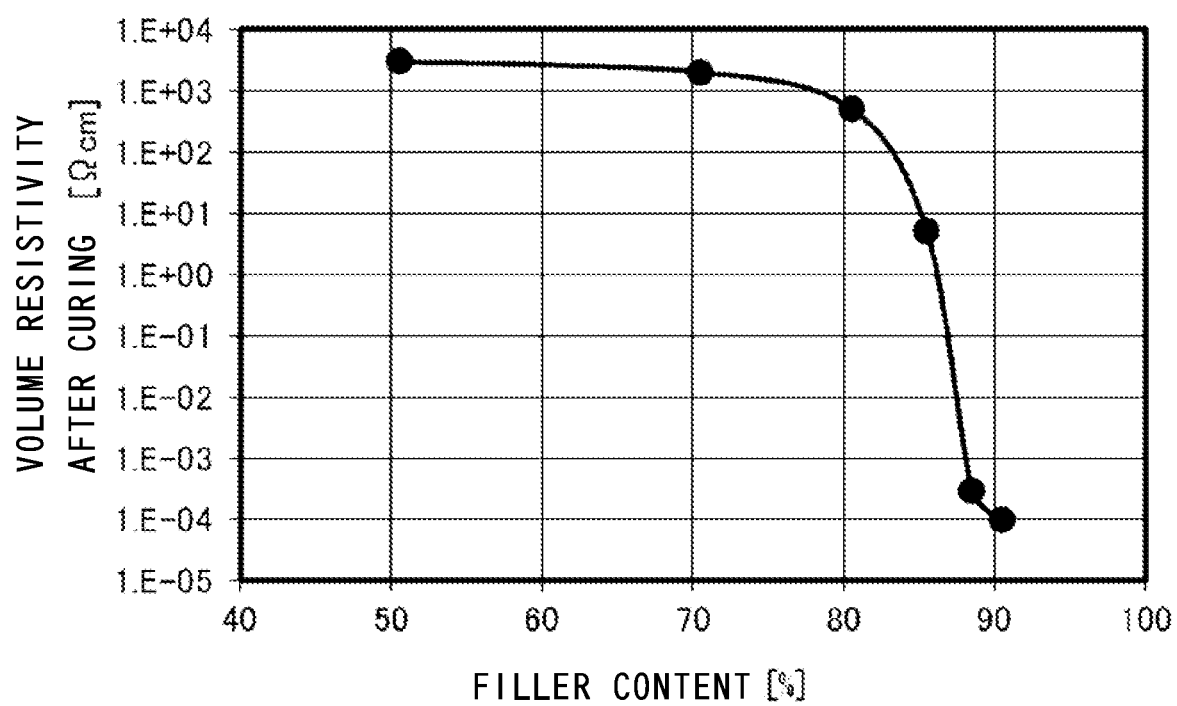

ELECTRICALLY CONDUCTIVE ADHESIVE AGENT, JOINED BODY, AND JOINT

CROSS-REFERENCE TO RELATED APPLICATIONS

This application is the United States national phase of International Application No. PCT/JP2014/060728 filed Apr. 15, 2014, and claims priority to Japanese Patent Application No. 2013-162932 filed Aug. 6, 2013, the disclosures of which are hereby incorporated in their entirety by reference.

TECHNICAL FIELD

The present invention relates to an electrically conductive adhesive agent that contains thermosetting resin using an organic acid metal salt as a hardening accelerator, a joined body and a joint.

BACKGROUND TECHNOLOGY

Electrically conductive bonding material is a general term for the electrically conductive adhesive agent and an electrically conductive joining agent. In the other words, the electrically conductive adhesive agent indicates an agent that is used for allowing the metals to adhere to each other at lower temperature than a melting point of electrically conductive metallic powder. The electrically conductive joining agent indicates an agent that is used for melting the electrically conductive metallic powder and joining metals to each other.

Solder has been often used as the electrically conductive joining agent for joining various kinds of electronic circuits to a circuit board and the solder has been melted so that various kinds of electronic circuits are joined to the circuit board. Although lead-free solder such as Sn—Ag—Cu or the like has been used as solder material, taking into consideration any environmental influences, this solder has a higher liquidus temperature than that of the conventional lead-containing solder by 30 degrees C. or higher. Since temperature within a reflow furnace is very higher than the liquidus temperature, this gives a high thermal shock (thermal stress) to the electronic parts and/or the circuit board to be joined.

Parts-joining material using the electrically conductive adhesive agent has been studied with the object of reducing the thermal stress. This electrically conductive adhesive agent contains electrically conductive metallic powder, thermosetting resin, a hardening agent and a hardening accelerator and pieces of the electrically conductive metallic powder are densely contacted to each other following the hardening of the resin by heating so that various kinds of electronic circuits can be joined to the circuit board without melting the electrically conductive metallic powder (see patent documents 1 and 2).

PRIOR ART DOCUMENTS

Patent Documents

Patent Document 1: Japanese Patent Application Publication No. 2011-061241
Patent Document 2: Japanese Patent Application Publication No. 2012-067274
Patent Document 3: Japanese Patent Application Publication No. 2001-219294
Patent Document 4: Japanese Patent Application Publication No. 2010-144150

Non Patent Documents

Non Patent Document 1: Panasonic Technical Journal, Vol. 59 No. 1, 72-77

SUMMARY OF THE INVENTION

Problems to be Solved by the Invention

When an amine-based hardening agent is used as the hardening agent, it is possible to cure the thermosetting resin quickly. On the other side, it is required to be managed under frozen storage of, for example, −10 degrees C. to prevent any curing reaction from occurring.

When an acid anhydride is used as the hardening agent, it takes a long time to cure the resin, which is hard to be used from a view of a manufacture process. In order to shorten the curing time, it is necessary to add any suitable hardening accelerator.

Further, even when melting the solder to join various kinds of electronic circuits to a circuit board, any bonding materials to which thermosetting resin, a hardening agent for curing the thermosetting resin and the like are added have been also proposed (see patent documents 3 and 4). They, however, include the same problem as that of the above-mentioned electrically conductive adhesive agent.

Non patent document 1 discloses that Sn-3.0Ag-0.5Cu solder (each numerical value indicates weight % and in the following solder composition, it also indicates weight % unless otherwise stated), epoxy resin and flux containing glutaric acid are heated to form any organic acid metal salts, and the organic acid metal salts open an epoxy ring. The curing time therefor, however, requires around 7 hours.

Although Ag has been used as filler in the patent document 2, low Ag content in the solder is in progress because Ag is expensive. It is desirable to adopt any filler instead of Ag even in the electrically conductive adhesive agent.

This invention has solved such problems and has an object to provide an electrically conductive adhesive agent which cures thermosetting resin using the acid-anhydride-based hardening agent and allows the thermosetting resin to cure in a short time on the assumption that the electrically conductive adhesive agent is used for allowing the metals to adhere to each other at lower temperature than the melting point of the electrically conductive metallic powder. This invention also has an object to provide a joined body and a joint.

Means for Solving the Problems

The inventors of this application have focused on that an organic acid metal salt produced by reaction of the electrically conductive metallic powder and the organic acid during a heating process functions as a hardening accelerator and have found out that the thermosetting resin can be cured thereby in a short time, for example, a time equivalent to a time that is required for the general reflow process.

This invention contains electrically conductive metallic powder including Sn, thermosetting resin, an acid-anhydride-based hardening agent and an organic acid wherein the electrically conductive metallic powder and the organic acid are reacted to produce an organic acid metal salt and the organic acid metal salt is used as hardening accelerator.

It is preferable that as the thermosetting resin, resin having flexibility such as epoxy resin of bisphenol A type to which an aliphatic skeleton is given is used. This resin allows both of flexibility and toughness to be given thereto.

It is also preferable that as the hardening agent, acid anhydride is used. It is further preferable to mix the resin having flexibility and the hardening agent so that they are 1:2 by a molar ratio. In addition, it is preferable to add the organic acid of 2 through 6 weight % to produce the organic acid metal salt.

Effect of the Invention

According to the invention, since the metallic powder and the organic acid are reacted during the heating process to produce the organic acid metal salt and the organic acid metal salt functions as hardening accelerator, it is possible to cure the thermosetting resin in a short time. Further, since the heating allows the hardening accelerator to be produced, any curing does not suddenly progress in the storage thereof. It is possible to perform refrigeration storage thereof at 2 through 10 degrees C., thereby enabling storage stability to be improved.

BRIEF DESCRIPTION OF THE DRAWING

FIG. 1 is a graph showing a relationship between the filler content and volume resistivity.

EMBODIMENTS FOR CARRYING OUT THE INVENTION

Composition Example of Electrically Conductive Adhesive Agent According to the Embodiment Electrically conductive adhesive agent of this invention contains electrically conductive metallic powder including Sn, thermosetting resin, a hardening agent and an organic acid.

As curing resin, there is resin that is cured by heat, light, ultraviolet rays or the like. As the curing resin, epoxy-based resin, phenolic resin, polyimide-based resin, silicon resin, polyurethane resin, unsaturated polyester resin and the like are conceivable, but the thermosetting resin is used because in the resin that is cured by light or ultraviolet rays, it is impossible to cure any resin positioned under the electronic parts when mounting the parts. As the thermosetting resin, the epoxy resin is the optimal resin.

As the epoxy resin, epoxy resin of bisphenol type is selected. As the bisphenol type, bisphenol A type, bisphenol AP type, bisphenol AF type, bisphenol B type, bisphenol BP type, bisphenol C type, bisphenol E type, bisphenol F type, bisphenol G type, bisphenol M type, bisphenol S type, bisphenol P type, bisphenol PH type, bisphenol TMC type, bisphenol Z type and the like are exemplified. Preferably, it is the bisphenol A type.

It is said that the epoxy resin is excellent in electric and/or mechanical joining properties but is fragile and poor in drop impact characteristic. This is because when curing the epoxy resin, any peeling occurs at an electrode interface to raise a crack. The epoxy resin at which this phenomenon occurs is set to be standard resin.

When using any flexible resin in which, for example, an aliphatic skeleton is given to the epoxy resin, both the flexibility and the toughness are reinforced so that it is possible to prevent any crack by surface peeling from occurring.

Hardening agent is used to cure the epoxy resin. As the hardening agent, amine, an acid anhydride and the like can be used. When the amine is used, the reaction is progressed even if the refrigeration storage is performed, so that the epoxy resin is cured. Therefore, the acid anhydride is selected to perform the refrigeration storage thereof.

As the acid anhydride, acetic acid anhydride, propionic anhydride, succinic anhydride, maleic anhydride and the like are exemplified. In this embodiment, the succinic anhydride is used.

It takes a long time until the hardening merely by heating the epoxy resin and the acid anhydride. Therefore, the hardening accelerator is required. As the hardening accelerator, for example, phenolic compound, tertiary amine, quaternary ammonium salt, quaternary phosphonium salt, imidazole, organic acid metal salt, Lewis acid and the like are exemplified. In this embodiment, the organic acid metal salt is used.

The metallic powder constituting the organic acid metal salt may be replaced by the electrically conductive metallic powder itself for joining which is added to resin for joining. In this case, it is required to separately add nothing in order to produce the organic acid metal salt. Of course, the electrically conductive metallic powder may be separately added to produce the organic acid metal salt.

The organic acid metal salt produced by the reaction of the metallic powder and the organic acid during the heating process is utilized as the hardening accelerator. According to this method, since there is no hardening accelerator when it is stored, in other words, any hardening acceleration function is not operated, it is possible to perform the refrigeration storage, thereby enabling the storage stability to be improved.

As the electrically conductive metallic powder, Sn, Ag, Bi, Cu, Au, Ni, Sb or Pd itself or one or two species or more of metal or/and alloy in alloy consisting of the metals selected from the metallic powder group are exemplified. Sn itself is preferably used or a mixture or an alloy including Sn is used.

As the organic acid, any generic organic acid may be used. Low molecular organic acid is preferable. In this embodiment, glutaric acid is used.

Executed Examples

The following will describe concrete examples in which the invention is applied to the electrically conductive adhesive agent in the executed examples. This invention, however, is not limited to the following concrete examples.

FIG. 1 is a characteristic diagram showing a relationship between the content of the electrically conductive metallic powder and volume resistivity. The volume resistivity is obtained by (resistance value*cross section area/length). Its unit is Ωcm. In this example, the printing was performed on a ceramic substrate using the electrically conductive adhesive agent containing Sn powder, the epoxy resin, the hardening agent and the organic acid so that it could have a length of 11.5 mm, a width of 1.5 mm and a thickness of 0.12 mm. After hardening, its resistance value and volume resistivity were obtained.

As being clearly shown in FIG. 1, it is understood that when the electrically conductive metallic powder is contained in the adhesive agent so that its content is 88 through 90 weight % of the total 100 weight % of the adhesive agent, the volume resistivity of the adhesive agent suddenly falls down. When the content thereof becomes 90 weight %, the volume resistivity thereof falls down to $1*10^{-4}$ Ωcm so that conductive property required for the solder can be sufficiently endured.

The following examination was performed to find out a combination of the electrically conductive metallic powder (metallic filler) and the organic acid and the contents thereof when the organic acid metal salt was produced. All of the executed examples and the comparison examples contained electrically conductive metallic powder, epoxy resin, a hardening agent and an organic acid. When the epoxy resin cures, any exothermic reaction is accompanied. Accordingly, the exothermic reaction was observed by a Differential Scanning calorimetry (DSC) and temperature when thermosetting occurred and the volume resistivity after the hardening were measured. Measurement conditions of DSC were within a range of 25 through 300 degrees C. and temperature rising rate was 10 degrees C./min. The result thereof is shown in Table 1. The electrically conductive metallic powder used Sn, Cu or Ni and the organic acid used glutaric acid.

TABLE 1

|  | Executed Example 1 | Executed Example 2 | Comparison Example 1 | Comparison Example 2 |
|---|---|---|---|---|
| Electrically Conductive Metallic Powder | Sn | Sn | Cu | Ni |
| Organic Acid (wt %) | 0.5 | 2 | 2 | 2 |
| Peak Temperature (Degrees C.) | 216 | 204 | 255 | 280 |
| Volume Resistivity (Ωcm) | $6*10^{-3}$ | $3*10^{-4}$ | $3*10^3$ | $3*10^{-1}$ |

Peak temperature of the exothermic reaction is changed also by an addition amount of organic acid. When adding the organic acid of 0.5 weight %, the peak temperature was 216 degrees C. but when adding the organic acid of 2 weight %, it was 204 degrees C. which were decreased by 12 degrees C. Therefore, it is understood that an amount of the organic acid allows curing speed of the thermosetting resin to be accelerated.

As a result where the executed examples 1 and 2 were carried out with the amount of the organic acid being changed, there was difference between them in the volume resistivity. It is conceivable that the more the amount of the organic acid is, many organic acid metal salts are produced, so that the curing speed becomes faster, which enables pieces of Sn powder to be adhered more closely. In addition, it is conceivable that there is any action by the organic acid to remove any oxide film from the Sn surface.

Sn reacts with an organic acid so as to be easy to produce organic acid metal salts and enables the epoxy resin to cure at lower temperature than that of other metal. Namely, it is said that Sn is preferable for curing at the lower temperature.

Table 2 showed how a period of time when the epoxy resin cured was influenced by a relationship of a molar ratio between the epoxy resin and the hardening agent and presence/absence of the organic acid metal salt. As the organic acid metal salt, glutaric acid-Sn salt was produced and it was executed using a binder of the epoxy resin, the hardening agent and the organic acid metal salt. In the Table, a circle indicates curing; a triangle indicates semi-curing; and a cross indicates uncured.

TABLE 2

|  |  | Executed Example 3 | Comparison Example 3 | Comparison Example 4 |
|---|---|---|---|---|
| Molar ratio of Epoxy Resin: Hardening Agent |  | 1:2 | 1:2 | No Hardening Agent |
| Organic Acid Metal salt |  | 2 | — | 2 |
| Curing Temperature: 150 degrees C. | Curing Time: 3 min | X | X | X |
|  | Curing Time: 6 min | Δ | X | X |
|  | Curing Time: 9 min | Δ | X | X |
|  | Curing Time: 12 min | ○ | X | X |
| Curing Temperature: 200 degrees C. | Curing Time: 3 min | ○ | X | X |
|  | Curing Time: 20 min | ○ | Δ | X |

As being clearly shown in the comparison example 4, it is understood that when there is no hardening agent even if the same epoxy resin is used, the curing does not advance. This is the same in a case where the curing temperature is 150 degrees C. or in a case where the curing temperature is 200 degrees C. below. In the comparison example 3, a semi-curing was seen when about twenty minutes elapsed at a case of the curing temperature of 200 degrees C. while the epoxy resin and the hardening agent were mixed at a molar ratio of 1:2.

On the other hand, in the executed example 3, a semi-curing was seen when six minutes elapsed at a case of the curing temperature of 150 degrees C. below while the epoxy resin and the hardening agent were mixed at a molar ratio of 1:2 and the organic acid metal salts of 2 weight % was further mixed to this mixture. It completely cured when twelve minutes elapsed. Further, when setting the curing temperature to be 200 degrees C., it completely cured at only three minutes.

Thus, by adding the organic acid metal salts to the mixture of the epoxy resin and the hardening agent with a molar ratio of 1:2, it is possible to accelerate the curing and even when the curing temperature is set to be at a relatively low curing temperature of 200 degrees C., it is also possible to completely cure at around three minutes. This enables the curing to be performed for a short time.

Any flexibility was given to the epoxy resin and a drop impact test was performed to verify drop impact resistance characteristics. The drop impact test was performed as follows.

The prepared electrically conductive adhesive agent was printed onto a substrate for module and LGS having a size of 12 mm*12 mm was mounted thereon to prepare a substrate for verification. Next, this substrate for verification was positioned at a position floated by 10 mm from a pedestal and both ends of this substrate were fixed using a dedicated jig. Under this state, impacts of acceleration of 1500 G were repeatedly given thereto following JEDEC standards. Times until LGA was released from the substrate for module were then measured and they were used as drop times. The samples used in the drop test were limited to only the samples in which the epoxy resin cured and the volume resistivity thereof was order of $10^{-4}$ Ωcm. They were tested.

Table 3 is a table showing overall characteristics of the electrically conductive adhesive agent according to the invention. In the table, resins represented as "flexible resin" indicate the epoxy resins with flexibility, which have flexibility and toughness.

As the epoxy resin of bisphenol A type in this executed example, EPICLON EXA-4816 (made by DIC Corporation) or the like is known. A binder is referred to as "a mixture containing thermosetting resin, hardening agent, an organic acid and thixotropic agent".

Further, the thixotropic agent is added to keep a shape when the electrically conductive adhesive agent has been applied to a circuit board and may be any compound that does not become soft nor be melted at heating temperature but gives a thixotropy.

A composition rate of the organic acid and the thixotropic agent in Table 3 is weight % in the binder composition and a composition rate of the binder and the filler is weight % in the electrically conductive adhesive agent. The peak temperature is a peak temperature by the exothermic reaction when the epoxy resin cures based on the DSC measurement.

Even when using the flexible resin as the epoxy resin, it cured after the heating was added for three minutes at 200 degrees C. Its volume resistivity was an order of $10^{-4}$ Ωcm. In cases of the flexible resin in both of the executed examples 4 and 5, the times until the breaking by the drop impact were 100 times or more. It is thus understood that using the flexible resin is more preferable on the drop impact characteristic than using the standard resin as the epoxy resin in the executed example 6.

By comparing a case in which the molar ratio of the epoxy resin and the hardening agent is a mixture equivalent of mole in the comparison example 5 with a case in which it is 1:2 mixture wherein the hardening agent is much added like the executed example 4, there occurred a difference in the volume resistivity. This is because the epoxy resin cannot perfectly react in the state where the hardening agent is within the mixture equivalent of mole, so that degree of adhesion in Sn powder is deteriorated.

Further, it is determined that, even when the molar ratio is 1:2 like the comparison example 6, any volume resistivity as shown in each of the executed examples 4 through 6 cannot be obtained at all if any organic acid is not included.

Although these executed examples have used Sn powder as the electrically conductive metallic powder, there is a high probability that this invention can be performed in an alloy containing metal other than Sn such as, for example, Sn-1Cu alloy. Accordingly, Table 4 shows a result of test in which it was executed with alloys other than Sn powder. Regarding the binder, the same composition thereof as that of the executed example 4 was used.

In the executed example 10, an ally 1, Sn-3.4ag-0.7Cu-2Bi-5Sb-0.04Ni, was used as the electrically conductive metallic powder. Other alloys used pieces of the electrically conductive metallic powder shown in Table 4. The peak temperature is a peak temperature by the exothermic reaction when the epoxy resin cures based on the DSC measurement.

TABLE 3

|  | Executed Example 4 | Executed Example 5 | Executed Example 6 | Comparison Example 5 | Comparison Example 6 |
| --- | --- | --- | --- | --- | --- |
| Epoxy Resin of Bisphenol A Type | Flexible Resin | Flexible Resin | Standard Resin | Flexible Resin | Flexible Resin |
| Molar Ratio of Epoxy Resin: Hardening Agent | 1:2 | 1:2 | 1:2 | 1:1 | 1:2 |
| Organic Acid | 4 | 2 | 4 | 4 | 0 |
| Thixotropic Agent | 1 | 1 | 1 | 1 | 0 |
| Binder: the above Mixture | 12 | 12 | 12 | 12 | 12 |
| Filler: Sn powder | 88 | 88 | 88 | 88 | 88 |
| Volume Resistivity (Ωcm) | $2*10^{-4}$ | $8*10^{-4}$ | $3*10^{-4}$ | $1*10^{-2}$ | Unmeasurable |
| Times until Breaking by Drop Impact | 100 or More | 100 or More | 1 | — | — |
| Peak Temp (Degrees C.) | 160 | 190 | 162 | 164 | — |
| Curing after 3 minutes elapsed at 200 degrees C. | Cured | Cured | Cured | Cured | Uncured |

TABLE 4

| | Executed Example 7 | Executed Example 8 | Executed Example 9 | Executed Example 10 | Comparison Example 7 | Executed Example 8 |
|---|---|---|---|---|---|---|
| Electrically conductive Metallic Powder | Sn—3.0Ag—0.5Cu | Sn—5Sb | Sn—10Sb | Alloy 1 | Sn—30Cu | Sn—77Cu |
| Peak Temp (Degrees C.) | 164 | 156 | 160 | 157 | 165 | 240 |
| Volume Resistivity ($\Omega$cm) | $3*10^{-4}$ | $4*10^{-4}$ | $5*10^{-4}$ | $9*10^{-4}$ | $1*10^{-2}$ | $8*10^{5}$ |

From the executed examples 7 through 10, it is understood that even when the electrically conductive metallic powder is any of the alloys other than Sn powder, an effect can be obtained. In the comparison example 7, the epoxy resin could start curing at the low temperature but its volume resistivity was $1*10^{-2}$ $\Omega$cm which was increased. In the comparison example 8, the epoxy resin did not start curing at 200 degrees C. or less.

The invention contains the electrically conductive metallic powder including Sn, the thermosetting resin, the acid anhydride hardening agent, the organic acid and the thixotropic agent, wherein the electrically conductive metallic powder reacts with the organic acid during the heating process to produce the organic acid metal salts which is the hardening accelerator. Therefore, it is applicable to any electrically conductive joining agent containing the electrically conductive metallic powder including Sn, the thermosetting resin, the acid anhydride hardening agent and the organic acid, without limiting to the above-mentioned electrically conductive adhesive agents. Further, it is also applicable to any joining when any electrical conductivity is required other than an object to join various kinds of electronic circuits onto a circuit board.

INDUSTRIAL APPLICABILITY

This invention is applicable to the joining of the parts by the electrically conductive adhesive agent, the soldering by solder paste containing the thermosetting resin and a joined body, a joint and the like joined by the adhesive agent.

The invention claimed is:

1. A method of forming a joint, comprising:
   heating an electrically conductive adhesive agent,
   wherein the electrically conductive adhesive agent comprises an electrically conductive metallic powder including Sn, a thermosetting resin, an acid-anhydride-based hardening agent, and an organic acid,
   wherein the electrically conductive metallic powder contains Sn of 85 weight % or more based on 100 weight % of the electrically conductive metallic powder,
   wherein the electrically conductive adhesive agent contains 88 through 90 weight % of the electrically conductive metallic powder based on 100 weight % of the electrically conductive adhesive agent,
   wherein the electrically conductive adhesive agent is heated at a temperature of 150 degrees C. or more and less than a melting point of the electrically conductive metallic powder to cause the electrically conductive metallic powder and the organic acid to react and to produce a hardening accelerator comprised of an organic acid metal salt,
   wherein, prior to heating, the electrically conductive adhesive agent does not include a hardening accelerator, and
   wherein the joint is formed without melting the electrically conductive metallic powder.

2. The method according to claim 1, wherein the electrically conductive metallic powder further includes at least one of:
   Ag, Bi, Cu, Au, Ni, Sb or Pd; or
   an alloy consisting of any combination of Sn, Ag, Bi, Cu, Au, Ni, Sb and Pd.

3. The method according to claim 1, wherein the thermosetting resin is an epoxy resin having an aliphatic skeleton, wherein the epoxy resin has flexibility.

4. The method according to claim 1, wherein the acid-anhydride-based hardening agent is selected from the group consisting of: acetic acid anhydride, propionic anhydride, succinic anhydride, and maleic anhydride.

5. The method according to claim 1, wherein the electrically conductive adhesive agent contains 2 through 6 weight % of the organic acid.

6. The method according to claim 1, wherein a volume resistivity of the electrically conductive adhesive agent in the joint is less than $1*10^{-3}$ $\Omega$cm.

* * * * *